METHOD FOR FABRICATING ELECTRICAL CIRCUIT COMPONENTS

Filed March 26, 1963

United States Patent Office 3,264,152

Patented August 2, 1966

3,264,152

METHOD FOR FABRICATING ELECTRICAL CIRCUIT COMPONENTS

Arthur W. Haydon, Milford, Conn., assignor to Tri-Tech, Inc., a corporation of Connecticut Filed Mar. 26, 1963, Ser. No. 267,982
1 Claim. (Cl. 156—3)

This invention relates to a method of making electrical circuit components. More particularly, the invention relates to an improved method of making electrical components of the printed circuit type.

There have been certain long-standing problems in the art of making components by printed circuit techniques. According to a typical procedure, a printed circuit may be formed from a three-ply laminated sheet comprising a middle supporting layer of insulating material having a metallic facing layer, such as copper foil, on each of its two sides, with a portion of the circuit component being formed on one side and the remaining portion on the other side of the supporting layer. Conductive connections between the two metallic surfaces of the laminate may then be made at selected points through the insulating layer by eyelets, for example. Typically, the metallic facing on each side of the supporting layer is partitioned into a number of conductive areas of various geometrical configurations separated from one another by the insulation of the supporting material. The resulting pattern or geometrical design which is comprised of these segmented, conductive areas is formed from the prior treating of metallic sheets of foil with an acid-resistant medium commonly called the resist.

The resist medium is usually deposited as a coating on the metallic foils by any one of several conventional printing techniques, e.g., photography, lithography, or silk-screening. The resist imprint, which is in the form of a representation of the conductive pattern of the desired circuit component, then acts as a protective coating for selected areas on each of the foil surfaces when the respective metallic sheets are subjected to chemical etching action. Etching of the exposed metallic surfaces of the three-layered laminate is continued until the entire thickness of each of the foil sheets in areas not protected by the resist coating is completely removed. The residue of metallic material, which remains on the surfaces of the middle supporting layer of the laminate after the etching process is finished, will then assume the desired conductive path pattern of the particular circuit component being formed.

A major disadvantage which occurs in the fabrication of printed circuit components in accordance with the above-described prior art technique is that, since thin layers of metallic foil are employed to form the conductive portions of the circuit component, the current-carrying capacity of the resulting conductive paths is quite limited. One generally known technique for increasing the current-carrying capacity of the conductive portions of the electrical circuit component is to make the conductive areas wider, thus undesirably increasing the dimensional size of the component. However, any attempt to raise the current-carrying capacity of the conductive portions by increasing the respective thickness of the metallic foil layers is invariably accompanied by a tendency of the chemical etching action to produce an undercutting effect on the metal immediately beneath the resist-protected surface areas, with a resultant weakening in the component structure to the point where the metallic residue remaining would oftentimes break away and fall off the supporting middle layer. This undesired tendency towards spreading or undercutting during the etching process is due to the diffusion of the acid medium in a diverging path as it dissolves away the metal and proceeds beneath the surface of the protective coating. Therefore, as a practical matter, a printed conductive path of given surface area would ordinarily have a maximum current-carrying capacity as the thickness of the metallic layer could not feasibly be increased by this or most other known techniques beyond a certain point without causing a detrimental weakening in the mechanical structure of the laminate, thereby reducing the quality and reliability of the electrical component produced.

There is one known method for increasing the thickness and thus the current-carrying capacity of printed circuit conductors by approximately a factor of two without the above described deleterious effects on the structural strength and rigidity of the component. In this latter method the metallic foil sheet is initially etched, on one side only, until approximately one-half the thickness of metal in areas unprotected by the resist coating is removed. The partially-etched foil sheet is then affixed by its etched side to an insulating base layer or support member, leaving as an exposed side the previously-unetched surface of the metal sheet. The formation of the circuit component is then completed by a further etching step which removes the remaining half of the metal from the areas unprotected by the resist coating. While this approach substantially reduces the acid-undercutting effect, since only half the foil thickness is penetrated from each side of the metal sheet, two separate etching steps of substantially equal time duration are required to fabricate the printed circuit component.

It is a principal objective of the present invention to overcome this time-consuming limitation of this last-mentioned method while retaining all its important advantages, namely, the formation, by printed circuit techniques, of electrical components which have substantially twice the current-carrying capacity of those formed from conventional techniques, by providing for the doubling in the optimum thickness of the metallic conductive paths without corresponding weakness or reduction in the mechanical strength or quality of the circuit component.

Another principal objective of the proposed method for fabricating electrical components by printed circuit techniques is the utilization of metallic foil layers in a multi-ply laminate having sufficient thickness and structural integrity to possess the necessary mechanical strength for the forming out, as an integral part of the metallic residual areas, of various three-dimensional elements, such as brackets, ferrules, soldering terminals, ridges and the like; whereas the foil layers employed in conventional printed circuit techniques, which must be relatively thin in order to be satisfactorily etched, are normally attached insecurely to the supporting base layer and are too weak for such forming without provision for auxiliary support.

In accordance with the present invention, a metallic sheet of approximately twice conventional foil thickness, i.e., the thickness of the sheet being such that it could not be satisfactorily etched completely through from one side because of the above-described effects, is imprinted with an acid resistant medium on both sides thereof. The resist imprint is in the form of a representation, in registered relationship, of the conductive pattern of the electrical component which is to be formed.

The imprinted sheet is then subjected to chemical etching action simultaneously on both sides to remove metallic material in areas unprotected by the resist medium. The etching action is continued until most but not all of the metal in the unprotected areas is removed, the remaining amount of metal being in the nature of a relatively thin, web-like structure connecting the areas protected by the resist pattern imprint and sufficiently strong to provide temporary support therefor. The sheet of partially-etched metal is next formed into a two-ply laminate by coating one side thereof with cement and affixing it to a base layer of insulated support material, or, alternatively, bonding the metal foil sheet under pressure to an insulating base layer of "uncured" material, such as fiber glass cloth impregnated with epoxy resin. The etching away of the remaining metallic material in the unprotected areas is then completed from the exposed metal surface of the laminate. When this second etching step has been completed and the webbing structure has been totally removed, residual areas of metal bonded by the cement or epoxy resin to the insulated supporting layer will remain, corresponding to the desired conductive regions of the electrical component.

As the removal of metal by chemical etching from one surface of the foil sheet penetrates only slightly more than halfway into the thickness of the sheet, and the etching from the other surface penetrates somewhat less than halfway (the difference in the respective penetrations being dependent upon the thickness of the webbing structure), very little acid-undercutting beneath the surface of the protected regions results. Thus metallic foil sheets, having approximately twice the optimum thickness of those heretofore used in printed circuit techniques, may be feasibly employed in producing electrical components according to the improved method herein proposed.

Furthermore, on account of the manner in which the two-ply laminate is formed, through cementing or epoxy bonding of the metallic foil sheet to an insulating base material prior to the final etching process, the conductive areas of metal remaining after the completion of the etching action are firmly attached to the insulating layer, as the cement coating or epoxy material fills into the empty pockets created beneath the webbing structure and thus extends in considerable thickness around the boundary edges of the various conductive regions. Therefore, the tendency for the residual metallic areas which form the conductive portions of the electrical component to break off from the insulated supporting layer is greatly reduced.

After the conductive regions of the component have been formed and the metal in the regions unprotected by resist has been completely removed, the residual metallic regions may then be fabricated where desired into various three-dimensional elements by suitable manufacturing techniques, such as bending, extruding, pressing, etc., as will more fully appear hereafter.

The teachings of the novel method herein proposed are readily adaptable to the fabrication of a printed circuit component of the "sandwich" type where the pattern of the conductive path portions of the electrical component is divided into two portions formed on opposite surfaces of an insulating layer. In such applications, two metallic sheets of approximately twice conventional foil thickness are each imprinted with an acid resistant medium on both sides thereof. The resist imprint is in the form of a representation, in registered relationship, of respective portions of the conductive pattern of the electrical component which is to be formed.

In a manner similar to the previously described embodiment, each imprinted sheet is subjected to simultaneous chemical etching action on both sides to remove metallic material in areas unprotected by the resist medium. The etching action is continued until only a thin supporting web of metal remains in the unprotected areas which is sufficiently strong to provide temporary support therefor. To form a sandwich-type laminate the two sheets of partially-etched metal are next coated on one side respectively with cement and affixed to a middle layer of insulated support material, or, alternatively, bonded under pressure to an insulating layer of "uncured" material. The etching away of the remaining metallic material in the unprotected areas is then completed from the two exposed surfaces (i.e., the respective exposed surface of each of the two metallic sheets) of the three-ply laminate. When this second etching step has been completed and the webbing structure has been totally removed, residual areas of metal bonded by the cement or epoxy resin to the insulated supporting layer will remain, corresponding to the desired conductive regions of the electrical component. Conductive connections between metallic regions on the respective surfaces of the laminate may then be effected through the insulating layer at selected points by suitable conventional means, such as riveting, "plating-through," and the like, or by a spot-welding technique which the method of the present invention renders especially advantageous for use in certain printed circuit applications.

A particularly advantageous application of the present invention arises when this printed circuit process is employed to fabricate the thin rotor disc element of certain types of D.C. electric motors and generators, such as the kind described in Haydon patent, 2,847,589 issued August 12, 1758, and in the U.S. patent applications of Haydon et al. S.N. 142,871, filed October 4, 1961 and Kavanaugh S.N. 123,780, filed July 13, 1961 (now U.S. Patent No. 3,239,705, granted March 8, 1966). It is oftentimes desirable from a design standpoint to maximize the performance characteristics of such dynamoelectric devices by increasing the current-carrying capacity of the rotor windings, as well as their number, consistent with dimensional considerations. Thus the design objective in such motors and generators is to incorporate as many ampere-turns as possible into a given size rotor disc. The present invention permits a rotor of this type to be constructed by printed circuit techniques in approximately one-half the etching time and with approximately twice the current-carrying capacity as before. In addition, the doubling of the cross-sectional area of the conductors, without a concomitant change in the length of the current path, reduces the electrical resistance of the rotor, and hence the $I^2R$ or copper loss, by a factor of two. Therefore, the efficiency and performance of the dynamoelectric machine may be improved significantly without any appreciable increase in the size or weight of the resultant assembly.

The foregoing and other objects, features, and advantages of the invention will be more readily undrestood upon consideration of the following detailed description of the invention, as illustrated in the accompanying drawings.

FIG. 3 is a fragmentary, sectional view of a portion of the imprinted metallic sheet, which is to form the side of the rotor disc shown in FIG. 1, when the foil has been partially-etched through from both sides in accordance with the method of the present invention.

FIG. 4 is a fragmentary, sectional view of two partially-etched metallic foil sheets (corresponding to the segments, taken through the plane at 3—3, of the rotor windings on opposite faces of the rotor disc shown in FIG. 1), after the coating of each with a cement on one side thereof, and an interposed middle layer of insulating material.

FIG. 5 is a fragmentary, sectional view showing the "sandwich" or three-ply laminated structure obtained from the elements shown in FIG. 4, after the two partially-etched metallic sheets have been cemented to the middle layer of insulating material.

FIG. 6 is a fragmentary, sectional view of the laminated structure of FIG. 5 showing the metallic portions (corresponding to the segments of the conductive windings of the rotor disc shown in FIG. 1) remaining after the second etching step of this embodiment of the process has been completed.

Figures 1, 2, 3, 4, 5, 6:
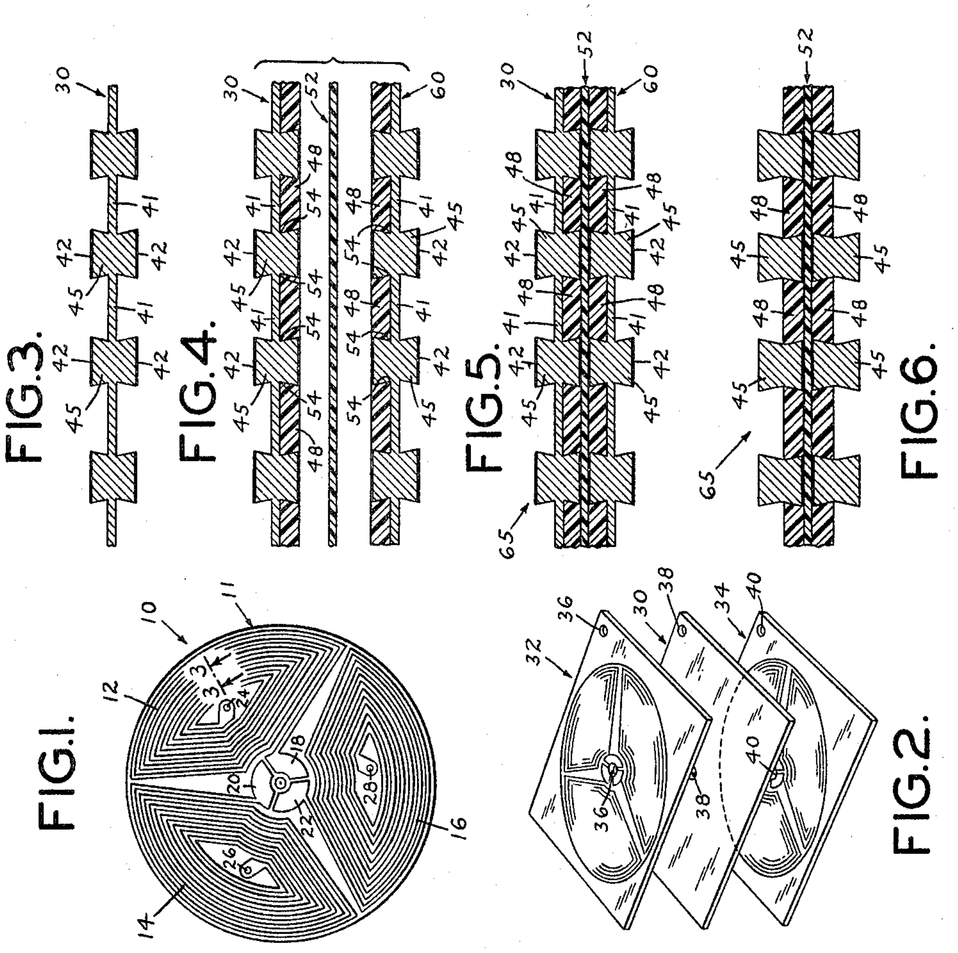
FIG. 1 is a plan view of an electrical component, exemplarily in the form of a disc-type rotor for a D.C. motor having printed circuit windings and commutator segments, which is to be formed in accordance with the teachings of the present invention.
FIG. 2 is a pictorial diagram illustrative of the step wherein a resist pattern of the conductive portions of one side of the electrical component of FIG. 1 is imprinted by photographic techniques onto both sides of a metallic sheet of foil thickness.
FIGS. 3–6 illustrate the steps of the printed circuit process of the present invention.

Referring now to FIG. 1, there is shown therein an electrical component designated generally as 10, which is in the form of a thin, disc-type rotor for a D.C. motor, such as the type disclosed in the aforementioned Haydon et al. and Kavanaugh applications, having three Y-connected windings 12, 14, and 16 terminating in respective commutator segments 18, 20 and 22. These rotor windings contained on the shown face 11 of the disc are connected at 24, 26, and 28, respectively, to corresponding windings on the opposite face of the rotor disc (not shown). The rotor windings on the side of the rotor disc not shown are exact counterparts of those depicted on the side 11 of the rotor shown in FIG. 1, except that they each terminate at the center of the disc in a common ring conductor, rather than in respective commutator segments. The two faces of the rotor disc 10 which carry the respective rotor windings are separated by an interposed layer of non-conductive material which, besides serving to electrically insulate the windings from each other except at the prescribed connection points, also provides the necessary supporting structure for the rotor disc 10. The connections 24, 26, and 28 between the conductive areas on opposite faces of the rotor disc may be formed by riveting eyelets or by plating-through holes in the middle insulation layer in accordance with known techniques, or, alternatively, the conductive connections may be provided by spot-welding in a manner hereinafter described.

A more detailed description of the winding configuration and the function of this type of rotor element in operation (which forms no part of the present invention) may be found in the above-mentioned patent applications. For purposes of the present discussion, it is sufficient to state that this element 10 is exemplary of a class of electrical components which may be feasibly made by the method of the present invention with the resultant advantageous characteristics heretofore described.

It is desired that this electrical component 10, illustrated in FIG. 1, be manufactured by printed circuit techniques into a "sandwich" type structure comprising metallic patterns, corresponding to the conductive portions, e.g., the rotor windings and commutator segments of the component, affixed to opposite faces of a layer of rigid insulating material.

It is advantageous in many applications for D.C. motors of the type employing such a rotor disc to maximize the current-carrying capacity of the rotor, consistent with design limitations on the motor's dimensional size and weight.

As discussed in the introductory portion of this specification, the current-carrying capacity of the rotor disc was heretofore limited by the thickness of the foil sheet (typically 3 to 8 mils) from which a metallic pattern of the conductive portion of the rotor could be satisfactorily etched by printed circuit techniques. With the method of the present invention metallic sheets of approximately twice this conventional foil thickness may be etched to produce a printed circuit rotor disc having a substantially doubled current capacity without the deleterious effects, i.e., heating and concomitant efficiency losses, which would otherwise result.

FIG. 2 illustrates the step of producing an imprint of the resist pattern wherein a metallic foil sheet 30 of suitable material such as copper or aluminum with a nominal thickness approximately twice that heretofore used, i.e., 6 to 16 mils, after first having its two surfaces coated with a suitable photo-sensitive chemical, is then exposed on each side to a source of ultraviolet radiation (not shown) through identical photographic plates 32, 34 each bearing a negative pattern representation of the conductive path portions of the side 11 of the rotor disc 10 shown in FIG. 1. The registration of the pattern on both sides of the foil sheet 30 may be ensured, for example, through the use of one or more groups of alignment holes 36, 38, and 40 in photographic plate 32, foil sheet 30, and photographic plate 34, respectively.

After exposure is complete, the pattern on the foil sheet 30 is immersed in a developer bath which serves to remove the photo-sensitive material from the unexposed areas while the exposed areas, which have been hardened by the ultraviolet irradiation and are insoluble in the developer bath, remain. After development, the metallic foil 30 is thus covered on each face with an insoluble resist coating only on the image area (corresponding to the conductive portions of the side 11 of the rotor disc 10) and is bare on the non-image area. In some cases it may be desirable to heat the developed foil in order to toughen the coating on the image area so as to make it more acid-resistant. In a similar manner, a second metallic sheet of thickness equivalent to that of foil 30 is imprinted with a resist pattern corresponding to the conductive portions of the side of the rotor disc 10 which is not shown in FIG. 1.

Although the step of imprinting the resist pattern, corresponding to the conductive path portions of the electrical component 10, has been illustratively described as being produced by a photomechanical process, it is to be understood that any suitable imprinting technique, e.g., lithography, silk-screen, etc., may also be employed where feasible without departing from the scope of this invention.

The foil sheet 30, which now contains an imprinted resist pattern of the conductive portions of side 11 of the rotor disc 10, is next subjected for a controlled period of time to chemical or electrochemical action to remove the metal in areas unprotected by the resist pattern by simultaneous etching of both surfaces of the foil in a bath of a suitable acid or electrolytic fluid.

As illustrated in FIG. 3, the foil sheet 30 is allowed to stay in the etching solution until a major portion of the metal in the unprotected areas is removed by the acid or electrochemical action of the bath and only a thin, web-like structure 41 remains, connecting the areas 45 of the foil sheet 30 which are protected by the imprinted resist pattern coating 42. The thickness of the web structure 41 remaining should be of sufficient strength to provide temporary mechanical support for the partially-etched foil 30 after it is removed from the chemical bath. The precise thickness dimension of the metallic web structure 41 cannot be prescribed quantitatively as the relative thickness of the webbing required to provide supporting connection between the resist-protected areas 45 of the foil sheet 30 varies in each specific case and is influenced by the relative size, extent, and configuration of the latter. Generally speaking, about 70 to 80% of the metal thickness in areas unprotected by resist may be feasibly removed during this first etching step. Because of the interdependence of the above factors, which affect the stresses exerted on the webbing structure 41 by the aggregated masses of metal in the resist-protected areas 45, the actual thickness tolerances have to be determined empirically in each particular case.

FIGS. 4 and 5 represent the next step in the method of the present invention, wherein two foil sheets 30 and 60, each partially etched according to the preceding steps, are coated on one side respectively with a cementing compound 48, such as epoxy, and affixed to a middle layer 52 of suitable non-conductive material, such as fiber glass, providing the desired combination of electrical insulation and structural rigidity, to form a "sandwich" type laminate 65. If desired, this laminated structure 65 may also be formed in an alternative manner by a bonding under heat and pressure of the partially-etched foil sheets 30 and 60 to opposite sides of an interposed middle layer of suitable insulating material, such as thermosetting synthetic resin, while in the "uncured" state.

It is to be noted that, in the coating of the respective sides of the foil sheets 30 and 60 which are to be affixed to the middle insulation layer 52, the binder material 48 will, as illustrated at 54, tend to fill into the empty pockets created by the thickness of metal removed in the forming of the webbing structure 41 and thus will extend to considerable thickness around the slightly undercut boundary edges of the resist-protected regions 45.

FIG. 6 is illustrative of the last step of this process embodiment of the present invention wherein the foil sheets 30 and 60 comprising the outside surfaces of the composite laminated structure 65 are subjected to a second etching step to remove the small thickness of metal remaining in areas unprotected by the resist imprint, represented by the thin webbing structure 41, which is now no longer required for structural support purposes. As the greater portion of metal in the unprotected regions was removed from the foil sheets 30 and 60 during the first etching step, the laminate 65 need now be immersed in the bath for but a relatively short period of time. After this final etching is completed, the surfaces of the metallic areas 45, which are the residue of the etching process and represent the conductive portions of the electrical component 10, may then be cleansed of the resist coating material 42 with a suitable solvent in accordance with conventional practice.

As the conductive path portions of the finished electrical component 10 (the commutator segments and windings of the rotor disc shown in FIG. 1) fabricated by the printed circuit technique of the present invention possess approximately twice the thickness of those formed by prior methods, the resultant laminated component has substantially twice the current-carrying capacity of its prior art predecessors. The increased conductor thickness, attained with the present printed circuit process permitting the use of double-thick metallic foils, make it now feasible to employ metal fabrication techniques on the finished article, such as forming, bending, and the like, which are impractical with metal conductors of thinner cross-section.

Furthermore, in the embodiment described, substantially all of the metal (with the exception of the thin residual web 41 used to provide temporary mechanical support) is removed from the unprotected areas during the first etching step when the foil sheet is subjected to simultaneous etching from both sides. Thus the period of time required to fabricate the electrical component is substantially reduced over the prior art method wherein the removal of metal is accomplished in two separate etching steps of approximately equal duration.

An important advantage of the present invention is achieved in that the adhesive binder material extends into the empty pockets formed above the webbing structure created by the first etching step, and thus the tendency for the residual metal, comprising the conductive path portions of the finished electrical component, to break off from the insulated supporting layer is substantially lessened. This feature of the invention is particularly useful in high speed dynamoelectric machines where centrifugal forces of great magnitude must be endured by the rotating elements.

Although the removal of metal from the foil sheets has been described in the above illustrative method embodiment of the present invention as being effected by the use of acid etching fluids, it could alternatively be accomplished by an electrochemical process, wherein the metallic foil sheet imprinted with a resist pattern is made the electrical anode in a bath of chemical electrolyte which then attacks the foil in regions unprotected by the resist.

After completion of the etching process according to the method of the invention, the connections between conductive areas on opposite sides of the laminate may be readily effected by a number of suitable techniques, such as riveting, plating through holes pierced in the laminate, pressure stamping, and the like. For example, in FIG. 1, the rotor windings 12, 14, and 16 formed by the metallic residue of the etching process might be electrically joined to their respective counterparts on the other surface of the rotor disc 10 at connection points 24, 26 and 28 by the insertion of riveted eyelets through the pair of windings and the middle insulating layer of the laminate at the desired locations.

The particular circuit elements depicted herein are but illustrative of the large variety of conductive configurations whose reliable design is now attainable with the improved printed circuit techniques of the present invention.

The terms and expressions which have been employed here are used as terms of description and not of limitation, and there is no intention, in the use of such terms and expressions, of excluding any equivalents of the features shown and described, or portions thereof, it being recognized that various modifications are possible within the scope of the invention claimed.

What is claimed is:

In a method of making a printed circuit component by forming a resist pattern of an etch-resistant medium in registration on both sides of a metallic sheet and etching said sheet to form circuit paths of those areas on said sheet which are protected by said resist pattern, the steps of first etching both surfaces of said metallic sheet simultaneously until substantially more than one-half of the thickness of the metallic sheet in areas not protected by said resist pattern is removed and only sufficient web thickness remains after said first etching step to provide a temporary mechanical support for protected areas on said sheet, next affixing an insulating support member of etch-resistant material to one surface of said partially-etched sheet, and then further etching the other, exposed surface of said sheet until the remainder of the thickness of the sheet in said unprotected areas is removed.

References Cited by the Examiner

UNITED STATES PATENTS

| | | | |
|---|---|---|---|
| 2,974,284 | 3/1961 | Parker | 156—3 |
| 3,131,103 | 4/1964 | Bogue et al. | 156—3 |
| 3,138,503 | 6/1964 | Taraud | 156—3 |
| 3,177,103 | 4/1965 | Talley et al. | 156—3 |

OTHER REFERENCES

Photoetching Thin Parts—Steel, Nov. 18, 1957, pp. 153–156, especially p. 156.

ALEXANDER WYMAN, *Primary Examiner.*

JACOB STEINBERG, *Examiner.*